(12) United States Patent
Choi et al.

(10) Patent No.: US 6,891,766 B2
(45) Date of Patent: May 10, 2005

(54) SEMICONDUCTOR MEMORY TEST DEVICE

(75) Inventors: Jun Gi Choi, Seoul (KR); Kang Seol Lee, Seoul (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 137 days.

(21) Appl. No.: 10/330,925

(22) Filed: Dec. 27, 2002

(65) Prior Publication Data
US 2003/0179636 A1 Sep. 25, 2003

(30) Foreign Application Priority Data
Mar. 25, 2002 (KR) ........................................ 2002-16094

(51) Int. Cl.$^7$ ................................................. G11C 7/00
(52) U.S. Cl. ............... 365/201; 365/189.09; 365/230.06
(58) Field of Search ........................... 365/201, 189.09, 365/189.08, 189.11, 230.06

(56) References Cited

U.S. PATENT DOCUMENTS 6,661,218 B2 * 12/2003 Kim ......................... 324/158.1
6,751,134 B2 * 6/2004 Choi et al. ............. 365/189.11

* cited by examiner

*Primary Examiner*—Van Thu Nguyen
*Assistant Examiner*—Hien Nguyen
(74) *Attorney, Agent, or Firm*—Marshall, Gerstein & Borun LLP

(57) ABSTRACT

A semiconductor memory test device configured to reduce level variations of a core voltage and a pumping voltage by shorting an external power voltage and the pumping voltage according to input of a test signal in an operation life test or a burn-in test, and to control levels of the core voltage and a peri voltage according to a level of the external power voltage is disclosed herein. As a result, the semiconductor memory test device is configured to obtain a sufficient margin of the external power voltage and to adaptively transmit a stress voltage to 2.5 V/3.3 V DRAM.

20 Claims, 8 Drawing Sheets

SEMICONDUCTOR MEMORY TEST DEVICE

TECHNICAL FIELD

The present disclosure relates to semiconductor memory devices, and more particularly, to a semiconductor memory test device configured to stably maintain levels of a pumping voltage and a core voltage during an operation life test or a burn-in test.

BACKGROUND

Recently, there is strong demand for low power consumption because of rapid distribution of portable devices such as notebook computers and handheld computers. Therefore, a double data rate (DDR) DRAM has been widely used because of its high speed and low power consumption.

The DDR DRAM mostly uses 2.5 volts (V) or 3.3 volts (V) as a power voltage. Thus, a number of devices which can selectively use either 2.5 V or 3.3 V in one DRAM have been designed for different options.

In addition to the DDR DRAM, a number of combination devices, which can selectively use an external power voltage, have been designed in a field of a single data rate (SDR) DRAM. To select good products among the combination devices, an operation life test for testing an operation life of the devices under poor conditions and a burn-in test are performed.

FIG. 1 is a schematic diagram of a conventional semiconductor memory test device. The conventional semiconductor memory test device includes a reference voltage generating unit 1, a core voltage amplifying unit 2, a peri voltage amplifying unit 3, a core voltage comparing unit 4, a peri voltage comparing unit 5, a core voltage driving unit 6, a peri voltage driving unit 7, a VPP generating unit 8, a VBB generating unit 9, a VCP/VBLP generating unit 10, a core stress voltage generating unit 12 and a peri stress voltage generating unit 13.

Here, an amplifier A1 of the core voltage amplifying unit 2 receives a reference voltage from the reference voltage generating unit 1 through its positive (+) terminal. The negative (−) terminal of the amplifier A1 is connected to a common node of resistors R1 and R2. The amplifier A1 outputs a core reference voltage VREFC through its output terminal, which is coupled to the resistor R1.

An amplifier A2 of the peri voltage amplifying unit 3 receives the reference voltage from the reference voltage generating unit 1 through its positive (+) terminal. The negative (−) terminal of the amplifier A2 is connected to a common node of resistors R3 and R4. The amplifier A2 outputs a peri reference voltage VREFP through its output terminal, which is coupled to the resistor R3.

The core stress voltage generating unit 12 generates a core stress voltage VSTRESSC when a test signal TEST is enabled. An inverter IV1 inverts the test signal TEST to produce an inverted test signal /TEST. A PMOS transistor P1 has its source terminal configured to receive an external power voltage VDD and its gate terminal configured to receive the inverted test signal /TEST. An NMOS transistor N1 has its gate terminal and drain terminal commonly connected to a drain terminal of the PMOS transistor P1 in a diode type. An NMOS transistor N2 has its gate terminal and drain terminal commonly connected to a source terminal of the NMOS transistor N1 in a diode type.

The peri stress voltage generating unit 13 outputs a peri stress voltage VSTRESSP when the test signal TEST is enabled. An inverter IV2 inverts the test signal TEST to produce the inverted test signal /TEST. A PMOS transistor P2 has its source terminal to receive the external power voltage VDD and its gate terminal to receive the inverted test signal /TEST. An NMOS transistor N3 has its gate terminal and drain terminal commonly connected to a drain terminal of the PMOS transistor P2 in a diode type. An NMOS transistor N4 has its gate terminal and drain terminal commonly connected to a source terminal of the NMOS transistor N3 in a diode type.

A basic flow of the conventional semiconductor memory test device is described below. When the test signal TEST inputted to the core stress voltage generating unit 12 is a high level, the inverted test signal /TEST inverted by the inverter IV1 is inputted into the PMOS transistor P1 to turn on the PMOS transistor P1. When the PMOS transistor P1 is turned on, the external power voltage VDD is applied to the core stress voltage generating unit 12. Accordingly, the NMOS transistors N1 and N2 composing the diode drop the external voltage VCC by 2Vt (Vt is a threshold voltage) and output the dropped voltage. Therefore, the core stress voltage generating unit 12 outputs VDD−2Vt as the core stress voltage VSTRESSC.

The core voltage comparing unit 4 compares the core reference voltage VREFC from the core voltage amplifying unit 2 with the core stress voltage VSTRESSC from the core stress voltage generating unit 12, and outputs a voltage having a higher potential level of the two voltages (i.e., VREFC or VSTRESSC). The core voltage driving unit 6 receives the voltage from the core voltage comparing unit 4, and outputs a core voltage VCORE.

Accordingly, when the external power voltage VDD is VDD1+2Vt (hereinafter, VDD1 is a predetermined voltage value of the external power voltage VDD), a level gradient of the core voltage VCORE is varied. In addition, the VPP generating unit 8 outputs a pumping voltage VPP by using the core voltage CORE from the core voltage driving unit 6 as a reference voltage in response to the test signal TEST.

On the other hand, when the test signal TEST inputted to the peri stress voltage generating unit 13 is a high level, the inverted test signal /TEST inverted by the inverter IV2 is inputted into the PMOS transistor P2 to turn on the PMOS transistor P2. When the PMOS transistor P2 is turned on, the external power voltage VDD is applied to the peri stress voltage generating unit 13. Accordingly, the NMOS transistors N3 and N4 composing the diode drop the external power voltage VCC by 1Vt+α and output the dropped voltage. Therefore, the peri stress voltage generating unit 13 outputs VDD−1Vt−α as the peri stress voltage VSTRESSP.

The peri voltage comparing unit 5 compares the peri reference voltage VREFP from the peri voltage amplifying unit 3 with the peri stress voltage VSTRESSP from the peri stress voltage generating unit 13, and outputs a voltage having a higher potential level of the two voltages (i.e., VREFP or VSTRESSP). The peri voltage driving unit 7 receives the voltage from the peri voltage comparing unit 5, and outputs a peri voltage VPERI. Accordingly, when the external power voltage VDD is VDD1+1Vt+α, a level gradient of the peri voltage VPERI is varied. In response to the test signal TEST, the VPP generating unit 8 and the VBB generating unit 9 output the pumping voltage VPP and back bias voltage VBB of wanted level, respectively, which are used in the operation life test or the burn-in test.

FIG. 2a is a voltage graph in a state where the normal operation, operation life test operation and burn-in test operation are mixed in the conventional semiconductor memory test device for 3.3 V. As shown in FIG. 2a, when the external power voltage VDD is 3.3 V, it can be varied into 3.8 V during the normal operation. When the external power voltage VDD is 4.0 V, the level gradient of the core voltage VCORE is varied during the test operation.

The time point when the level gradient of the core voltage VCORE is varied must be determined with a margin considering the varing PVT (parameter, voltage and temperature). That is, when the level of the core voltage VCORE is 2.3 V under conditions of the high temperature and low speed test, the level gradient of the core voltage VCORE is varied if the external power voltage VDD is 4.0 V. Therefore, when the external power voltage VDD is at least 4.3 V, the level gradients of the peri voltage VPERI and the core voltage VCORE must be varied during the normal operation.

FIG. 2b is a voltage graph in a state where the normal operation, operation life test operation and burn-in test operation are mixed in the conventional semiconductor memory test device for 2.5 V. As depicted in FIG. 2b, if the external power voltage VDD is 2.5 V, the external power voltage VDD may vary up to 3.0 V during the normal operation. In addition, when the external power voltage VDD is 3.0 V, the level gradient of the core voltage VCORE is varied during the test.

The conventional semiconductor memory test device generates the pumping voltage VPP, bit line precharge voltage VBLP, cell plate voltage VCP and back bias voltage VBB by using the core voltage VCORE as the reference voltage in an OP region for performing the operation life test or a BI region for performing the burn-in test. Therefore, when the level of the core voltage VCORE is varied during the operation life test or the burn-in test, the level of the pumping voltage VPP is also varied. That is, region (B) of FIG. 2a shows a region where the level of the pumping voltage VPP is lower than that of the external power voltage VDD because of level variations of the core voltage VCORE. In this case, forward bias is generated between the external power voltage VDD and the pumping voltage VPP in the VPP generating unit 8 for generating the pumping voltage VPP. As a result, there is a problem in that a direct path is formed between the external power voltage VDD and the pumping voltage VPP. Thus, the level of the pumping voltage VPP is increased according to the level of the external power voltage VDD.

SUMMARY OF THE DISCLOSURE

A semiconductor memory test device is described herein. The disclosed semiconductor memory test device may be configured to stably maintain a pumping voltage regardless of level variations of a core voltage by shorting an external power voltage and the pumping voltage according to a test signal in an operation life test or a burn-in test. Further, the disclosed semiconductor memory test device may be configured to obtain a margin of an external power voltage and to stably maintain a wanted level of a core voltage regardless of a level of a pumping voltage by controlling a level gradient variation time and a level gradient of the core voltage according to a level of the external power voltage during an operation life test or a burn-in test.

The disclosed semiconductor memory test device includes a short circuit unit configured to maintain a level of a pumping voltage in a level of an external power voltage when a test signal is enabled, and a pumping voltage generating unit configured to output the pumping voltage by pumping a core voltage during a normal operation and to output the external power voltage from the short circuit unit when the test signal is enabled.

Alternatively, the semiconductor memory test device includes a core stress voltage generating unit configured to generate a core stress voltage according to input of a test signal, a core voltage comparing unit configured to compare a core reference voltage obtained by amplifying a reference voltage with the core stress voltage and to output a voltage according to a comparison result, and a core voltage driving unit configured to drive the voltage from the core voltage comparing unit and outputting a core voltage. When the test signal is enabled, a level gradient variation time and a level gradient of the core voltage are controlled according to a level of an external power voltage.

BRIEF DESCRIPTION OF THE DRAWINGS

The disclosure will be described in terms of several embodiments to illustrate its broad teachings. Reference is also made to the attached drawings.

DETAILED DESCRIPTION

The present disclosure will be described in detail with reference to the accompanying drawings.

Figure 1:
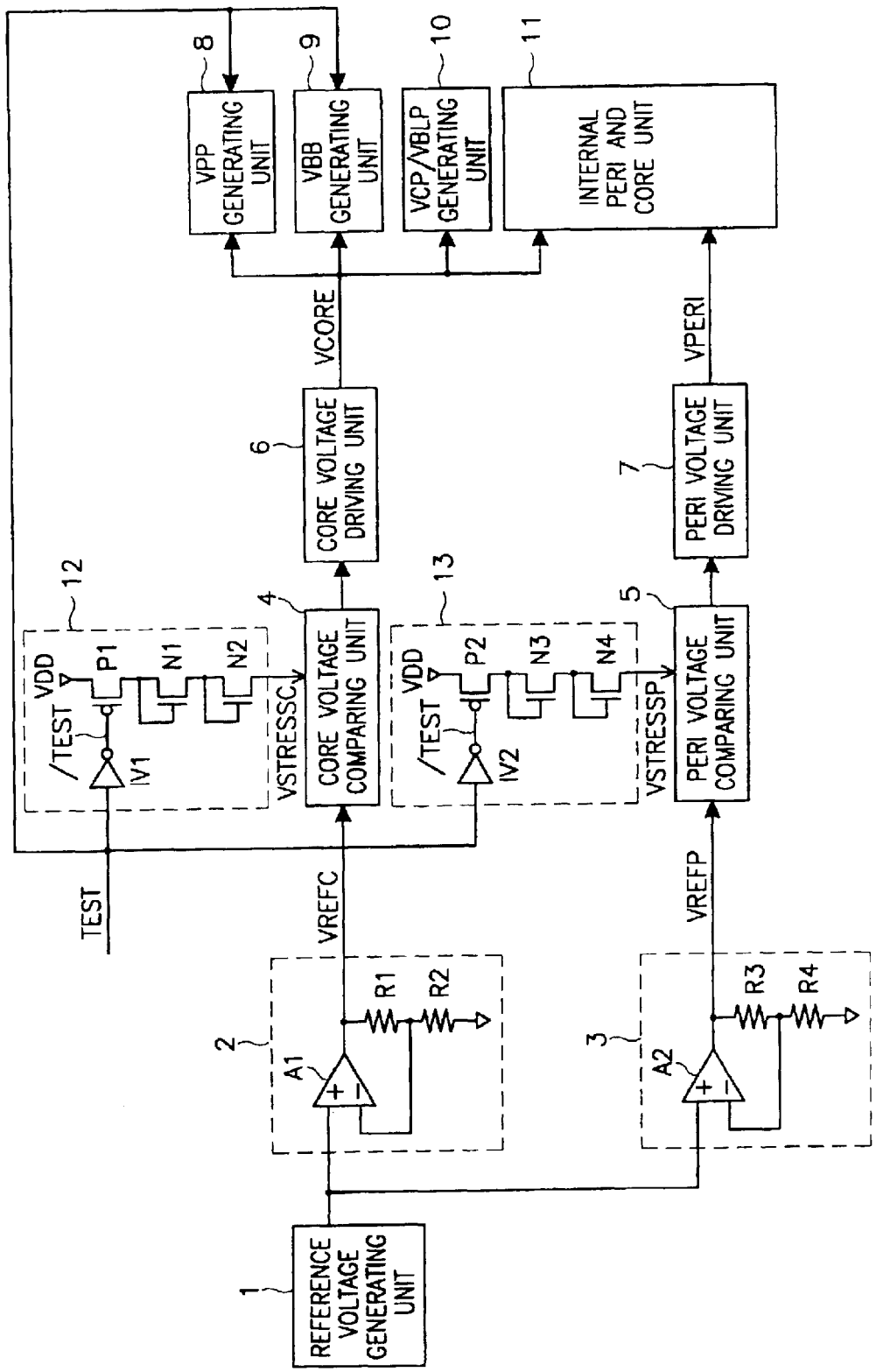
FIG. 1 is a schematic diagram of a conventional semiconductor memory test device.
Figure 2A:
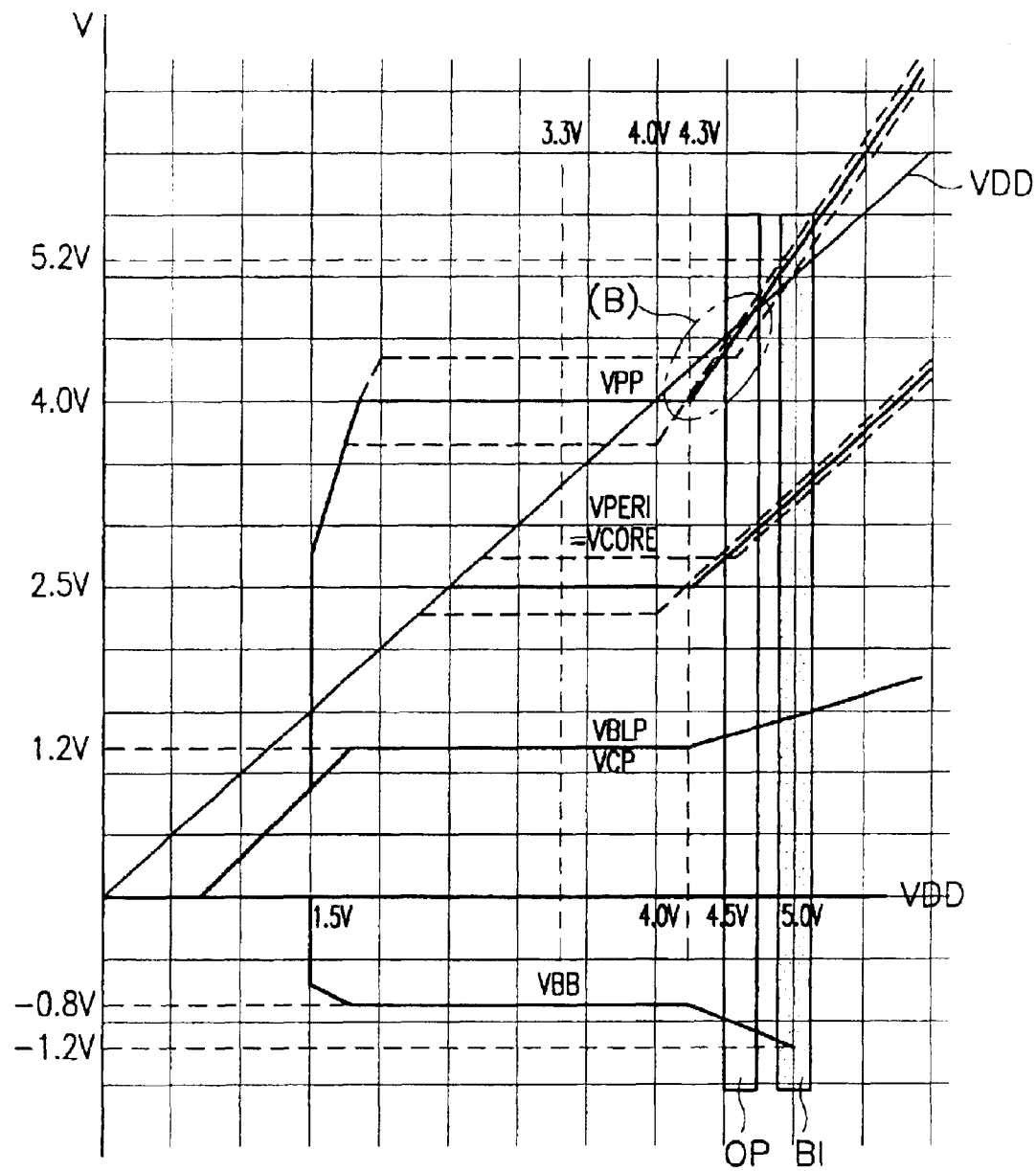
FIGS. 2a and 2b are graphs showing voltage levels of the conventional semiconductor memory test device.
Figure 2B:
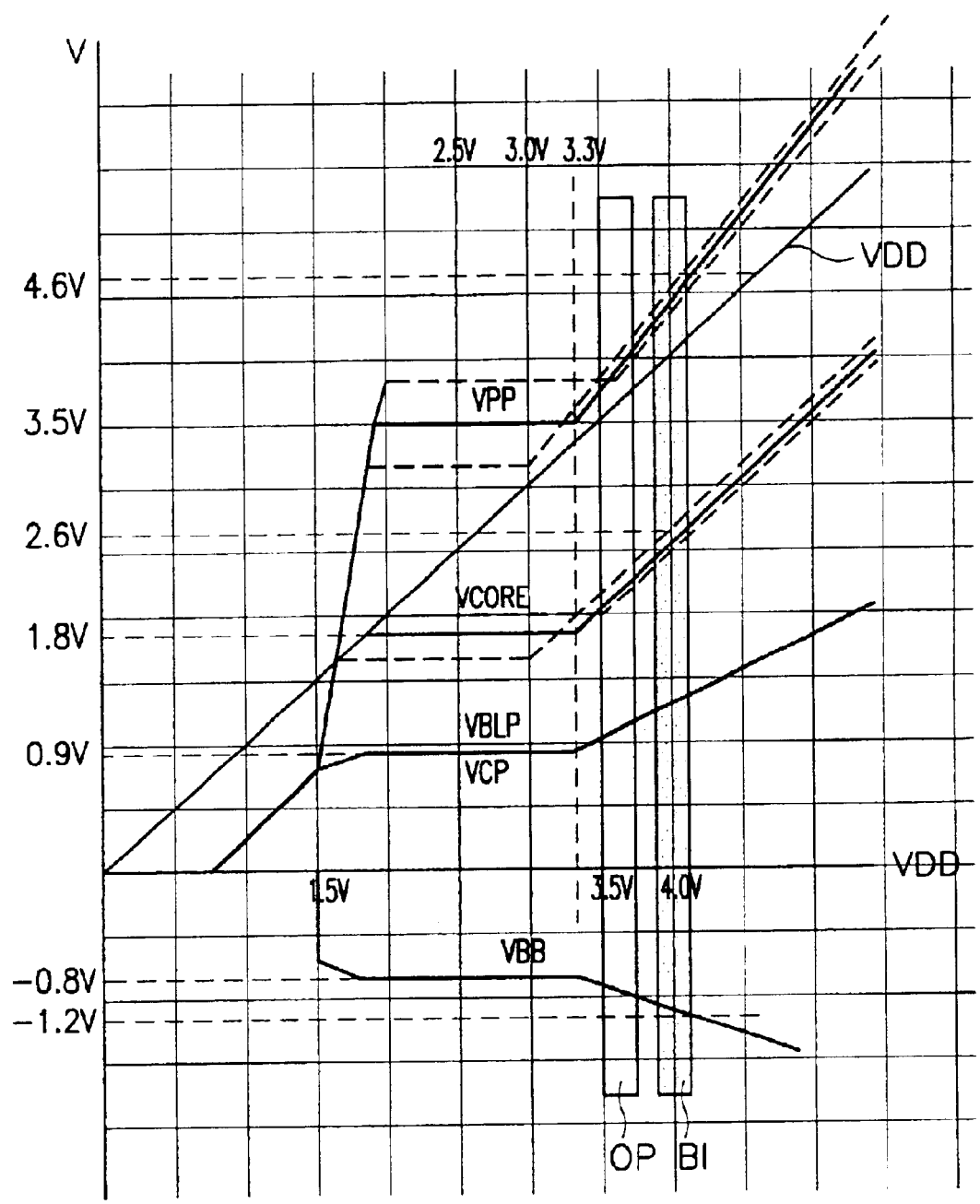
Figure 3:
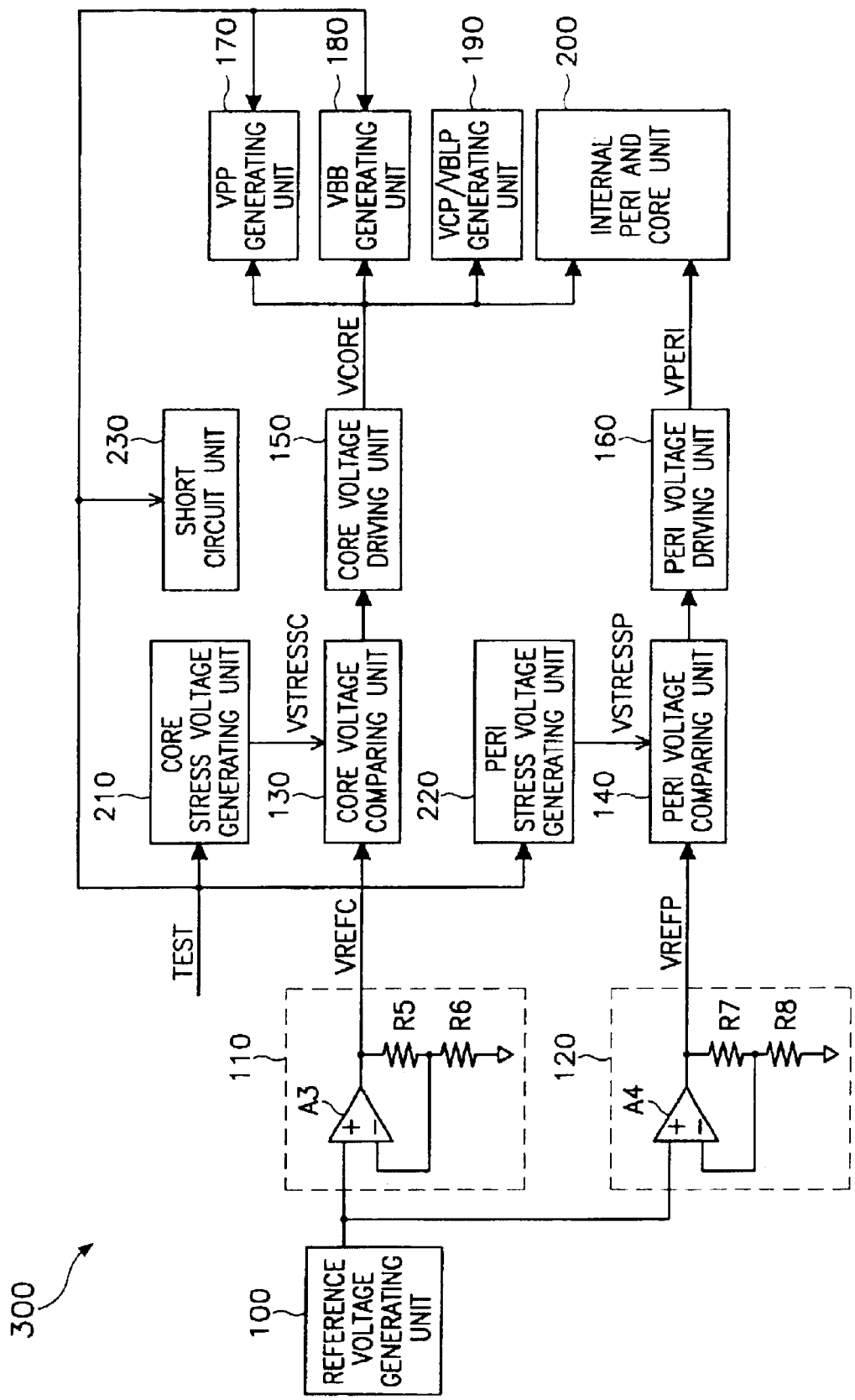
FIG. 3 is a schematic diagram of a semiconductor memory test device.

Referring to FIG. 3, a semiconductor memory test device 300 includes a reference voltage generating unit 100, a core voltage amplifying unit 110, a peri voltage amplifying unit 120, a core voltage comparing unit 130, a peri voltage comparing unit 140, a core voltage driving unit 150, a peri voltage driving unit 160, a VPP generating unit 170, a VBB generating unit 180, a VCP/VBLP generating unit 190, a core stress voltage generating unit 210, a peri stress voltage generating unit 220 and a short circuit unit 230.

Here, an amplifier A3 of the core voltage amplifying unit 110 receives a reference voltage from the reference voltage generating unit 100 through its positive (+) terminal. The negative (−) terminal of the amplifier A3 is connected to a common node of resistors R5 and R6. The amplifier A3 outputs a core reference voltage VREFC through its output terminal, which is coupled to the resistor R5. In addition, an amplifier A4 of the peri voltage amplifying unit 120 receives the reference voltage from the reference voltage generating unit 100 through its positive (+) terminal. The negative terminal of the amplifier A4 is connected to a common node of resistors R7 and R8. The amplifier A4 outputs a peri reference voltage VREFP through its output terminal, which is connected to the resistor R7.

The core voltage comparing unit 130 compares the core reference voltage VREFC from the core voltage amplifying unit 110 with a core stress voltage VSTRESSC from the core stress voltage generating unit 210, and outputs a voltage having a higher potential level of the two voltages (i.e., VREFC or VSTRESSC). The peri voltage comparing unit 140 compares the peri reference voltage VREFP from the peri voltage amplifying unit 120 with a peri stress voltage VSTRESSP from the peri stress voltage generating unit 220, and outputs a voltage having a higher potential level of the two voltages (i.e., VREFP or VSTRESSP).

The core voltage driving unit 150 drives the voltage from the core voltage comparing unit 130, and outputs a core voltage VCORE to an internal peri and core unit 200. The core voltage VCORE is used as a reference voltage for the VPP generating unit 170, the VBB generating unit 180 and the VBLP/VCP generating unit 190. The peri voltage driving unit 160 drives the voltage from the peri voltage comparing unit 140, and outputs a peri voltage VPERI to the internal peri and core unit 200.

The short circuit unit 230 shorts a pumping voltage VPP and an external power voltage VDD in response to the test signal TEST. In a normal operation, the VPP generating unit 170 generates the pumping voltage VPP by pumping the core voltage VCORE from the core voltage driving unit 150. Conversely, the short circuit unit 230 shorts the external power voltage VDD and the pumping voltage VPP in response to the test signal TEST for performing an operation life test or a burn-in test. As a result, the short circuit unit 230 stops the pumping operation of the VPP generating unit 170.

Figure 4:
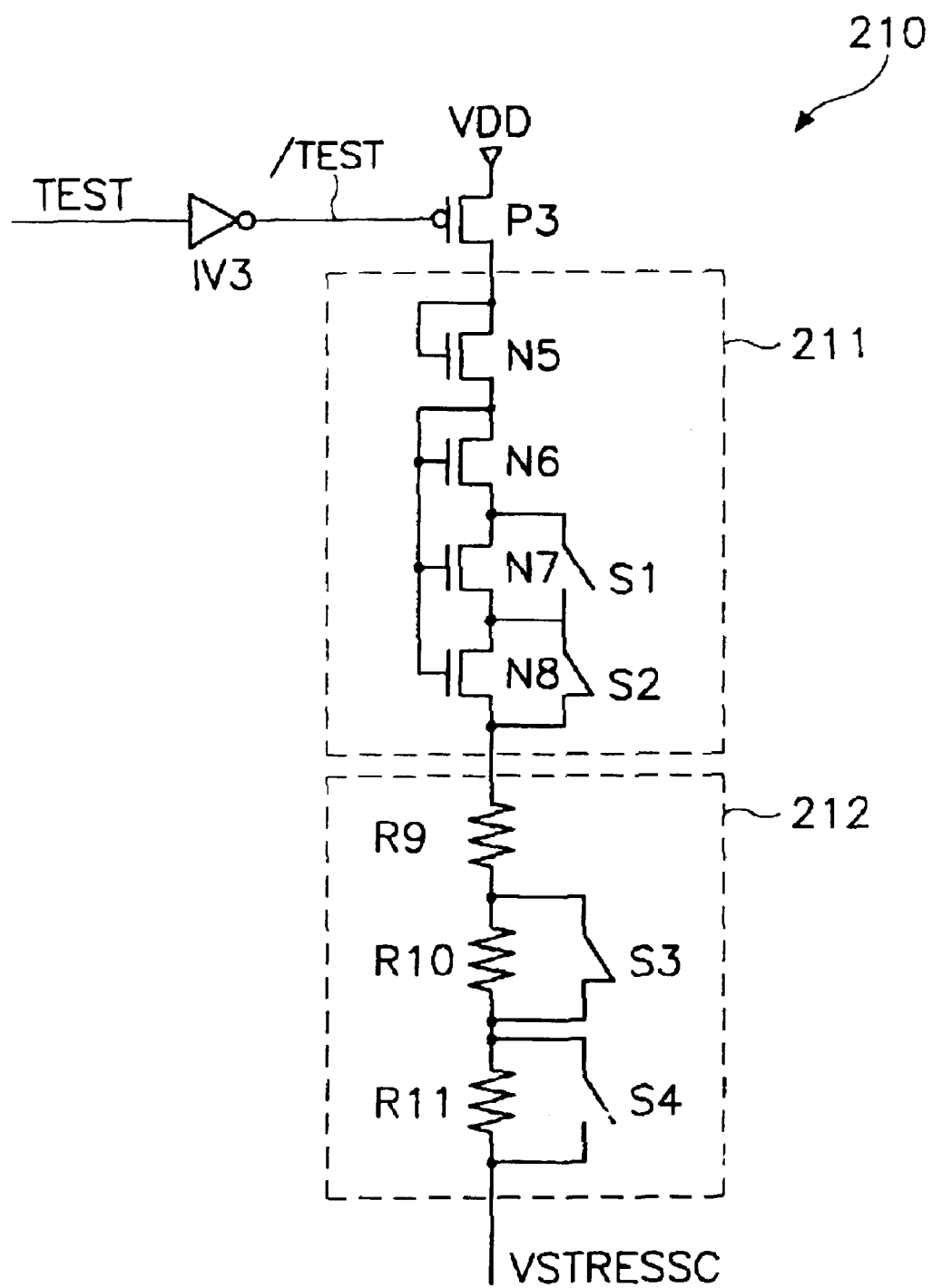
FIG. 4 is a detailed circuit view illustrating a core stress voltage generating unit of FIG. 3.

FIG. 4 is a detailed circuit view illustrating the core stress voltage generating unit 210 of FIG. 3. The core stress voltage generating unit 210 includes an inverter IV3, a PMOS transistor P3, a voltage dropping unit 211 and a voltage dividing unit 212.

The inverter IV3 inverts the test signal TEST. The PMOS transistor P3 has its source terminal to receive the external power voltage VDD and its gate terminal to receive the inverted test signal/TEST.

An NMOS transistor N5 of the voltage dropping unit 211 has its gate and drain terminals commonly connected to a drain terminal of the PMOS transistor P3 in a diode type. NMOS transistors N6–N8 are serially connected to have their respective gates commonly connected to a drain terminal of the NMOS transistor N6 in a diode type. Here, the NMOS transistor N7 includes a switch S1 between its drain and source terminals, and the NMOS transistor N8 includes a switch S2 between its drain and source terminals.

In addition, the voltage dividing unit 212 has resistors R9–R11 connected in series between the source terminal of the NMOS transistor N8 and an output terminal of the core stress voltage VSTRESSC. Here, the resistor R10 is connected in parallel to a switch S3, and the resistor R11 is connected in parallel to a switch S4.

The peri stress voltage generating unit 220 has the same structure as the core stress voltage generating unit 210 as described above, and thus detailed explanations thereof are omitted.

When the test signal TEST is enabled in a high level, the test signal TEST is inverted by the inverter IV3 to produce an inverted test signal/TEST. The inverted test signal/TEST is transmitted to the PMOS transistor P3 to turn on the PMOS transistor P3. When the PMOS transistor P3 is turned on, the external power voltage VDD is dropped by the NMOS transistor N5 composing the diode by 1Vt.

When the switch S1 is switched off and the switch S2 is switched on, the external power voltage VDD is dropped to 1Vt+α by the NMOS transistors N6 and N7 composing the diode. Therefore, the voltage dropping unit 211 outputs VDD−2Vt−α because of voltage drops of the NMOS transistors N5−N7.

When the switches S1 and S2 are both switched off, the external power voltage VDD is dropped to 1Vt+α+α' by the NMOS transistors N6–N8 composing the diode by. Accordingly, the voltage dropping unit 211 outputs VDD−2Vt−α−α'. Here, the NMOS transistors N7 and N8 are dummy transistors responsive to a switching state of the switches S1 and S2, respectively. Accordingly, a margin of the external power voltage VDD is obtained by controlling a level gradient variation time of either the core voltage VCORE or the peri voltage VPERI in the operation life test or the burn-in test according to the switching state of the switches S1 and S2.

The resistors R9–R11 determine the level gradient of either the core voltage VCORE or the peri voltage VPERI by dividing the voltage from the voltage dropping unit 211. That is, the gradient of either the core voltage VCORE or the peri voltage VPERI can be controlled by adjusting a number of the resistors according to the switching state of the switches S3 and S4.

The core stress voltage VSTRESSC is transmitted from the voltage dividing unit 212 to the core voltage comparing unit 130. The core voltage comparing unit 130 compares the core reference voltage VREFC with the core stress voltage VSTRESSC and outputs a higher voltage, which is typically the core stress voltage VSTRESSC. The core voltage driving unit 150 drives the core stress voltage VSTRESSC from the core voltage comparing unit 130 and outputs the core voltage CORE. As a result, the semiconductor memory test device 300 may control the level gradient and the level gradient variation time of the core voltage VCORE by the external power voltage VDD.

Figure 5:
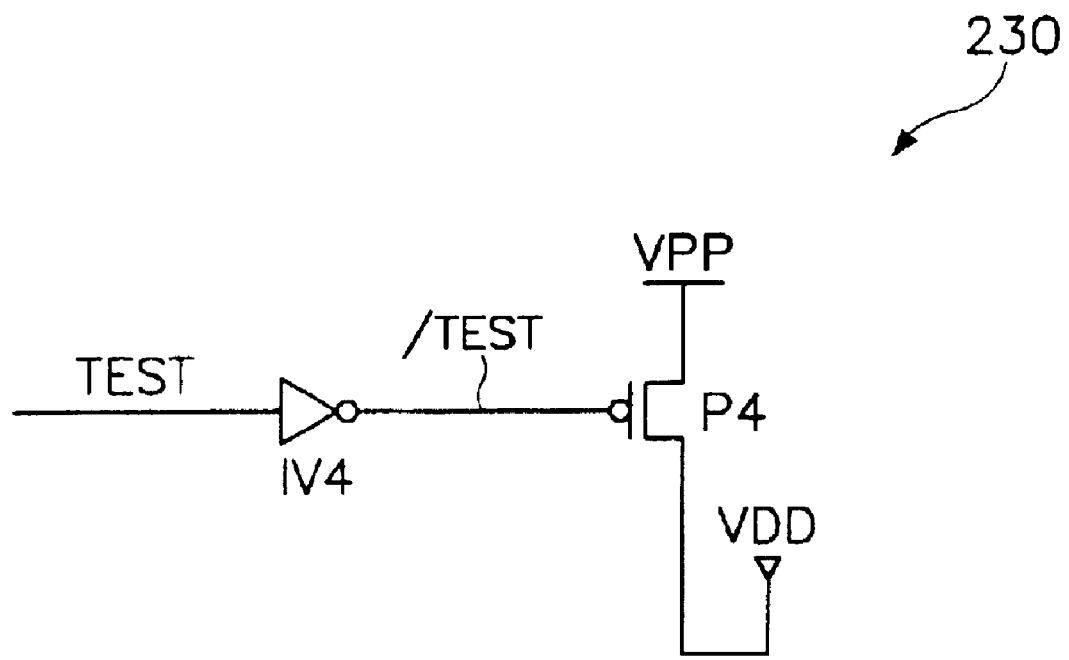
FIG. 5 is a detailed circuit view illustrating a short circuit unit of FIG. 3.

FIG. 5 is a detailed circuit view illustrating the short circuit unit 230 of FIG. 3. The short circuit unit 230 includes an inverter IV4 for inverting the test signal TEST. A PMOS transistor P4 has its source terminal configured to receive the pumping voltage VPP, its drain terminal configured to receive the external power voltage VDD and its gate terminal configured to receive the inverted test signal/TEST via its gate terminal.

When the test signal inputted to the short circuit unit 230 is a high level, the inverted test signal/TEST inverted by the inverter IV4 is inputted to the PMOS transistor P4 to turn on the PMOS transistor P4. When the PMOS transistor P4 is turned on, the pumping voltage VPP and the external power voltage VDD are shorted. Therefore, the VPP generating unit 170 stops the pumping operation and maintains the same voltage level as the external power voltage VDD regardless of the core voltage VCORE in response to the test signal TEST.

Figure 6A:
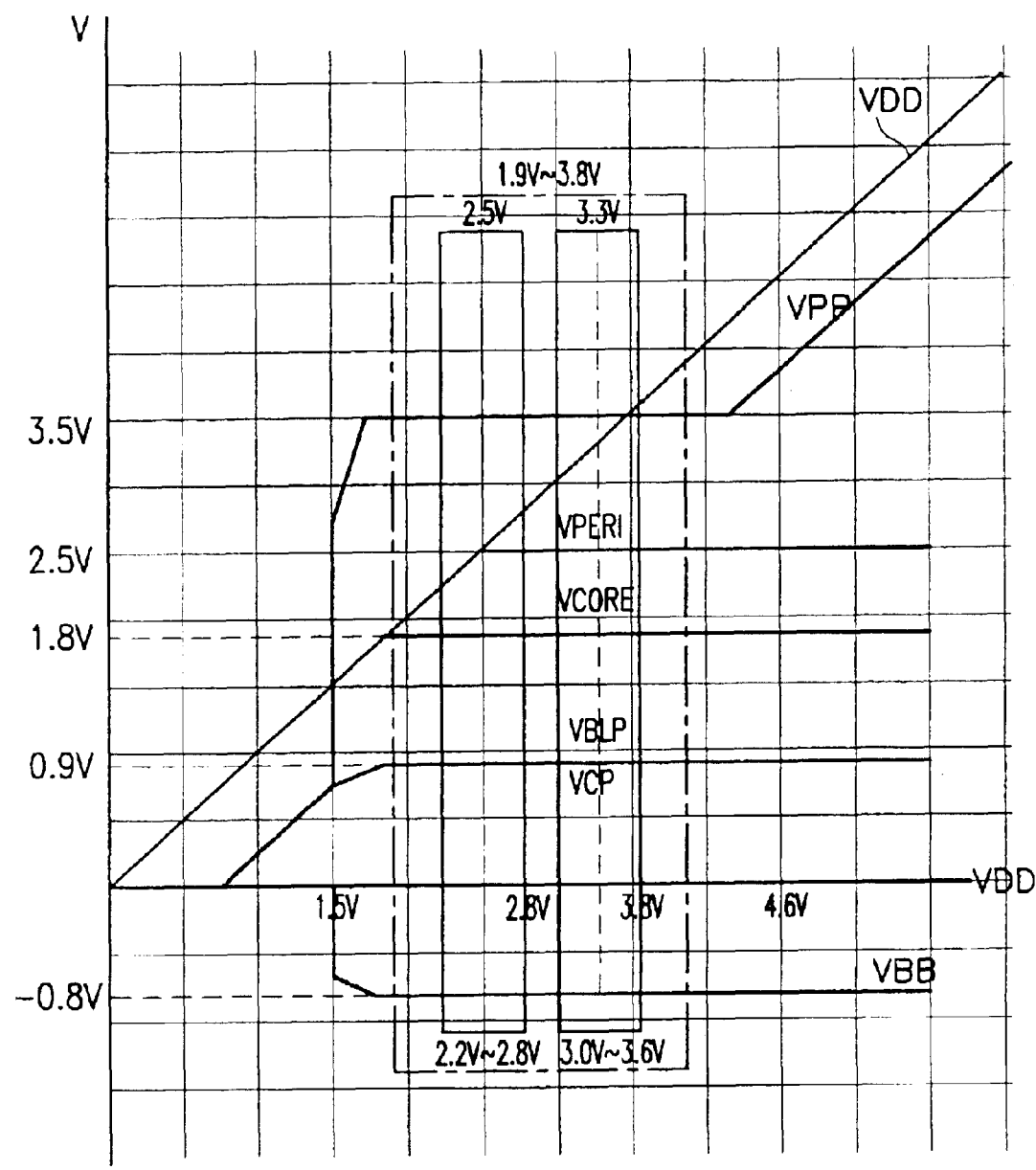
FIGS. 6a and 6b are graphs showing voltage levels of the semiconductor memory test device.

FIG. 6a is a graph showing voltage levels of a 2.5 V/3.3 V combination device in the normal operation. When the external power voltage VDD is either 2.5 V or 3.3 V, all the voltage levels are stably maintained regardless of variations of the external power voltage VDD. That is, the external power voltage VDD may vary from 1.9 V to 3.8 V but the other voltages stay the same level.

Figure 6B:
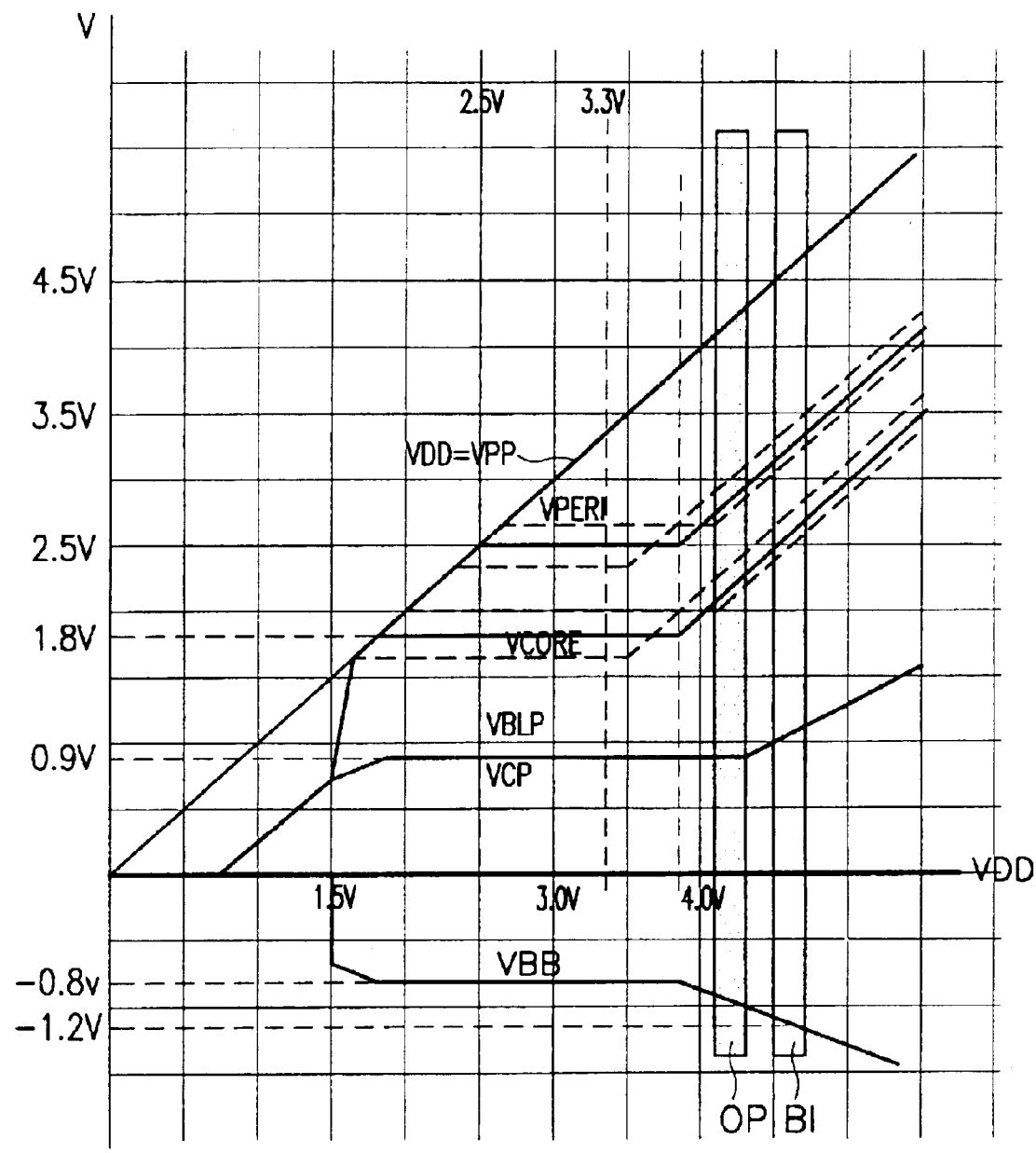

FIG. 6b is a graph showing voltage levels of a 2.5 V/3.3 V combination device in the operation life test and the burn-in test. In the test mode, the external power voltage VDD and the pumping voltage VPP are shorted to maintain the same level. When the external power voltage VDD is VDD1+2Vt+α because of the NMOS transistors N5–N7 of FIG. 4, the level gradient of the core voltage VCORE is varied. In addition, when the external power voltage VDD is VDD1+2Vt because of the NMOS transistors N5 and N6 of FIG. 4, the level gradient of the peri voltage VPERI is varied.

Accordingly, the margin of the external power voltage VDD can be obtained by controlling the level gradient variation time of the core voltage VCORE and the peri voltage VPERI and by adjusting a number of the diodes during the operation life test or the burn-in test. In addition, the level of the core voltage VCORE can be controlled regardless of the level of the pumping voltage VPP and by adjusting the level gradient of the core voltage VCORE during the operation life test or the burn-in test.

As discussed earlier, the external power voltage and the pumping voltage are shorted according to input of the test signal in the operation life test or the burn-in test. Thus, the pumping voltage is stabilized regardless of level variations of the core voltage.

Moreover, the margin of the external power voltage can be obtained by controlling the level gradient variation time of the core voltage and the peri voltage and by adjusting the number of the diodes during the operation life test or the burn-in test. In addition, the level of the core voltage can be stabilized regardless of the pumping voltage by controlling the level gradient of the core voltage according to the level of the external power voltage. As a result, it is possible to equally transmit the stress voltage proportional to each voltage of VPP, VCORE, VPERI, VBB, VBLP and VCP in the 2.5 V/3.3 V combination device.

Many changes and modifications to the embodiments described herein could be made. The scope of some changes is discussed above. The scope of others will become apparent from the appended claims.

What is claimed is:

1. A semiconductor memory test device comprising:
   a short circuit unit configured to maintain a level of a pumping voltage to a level of an external power voltage when a test signal is enabled; and
   a pumping voltage generating unit configured to output the pumping voltage by pumping a core voltage during a normal operation, and to output the external power voltage from the short circuit unit when the test signal is enabled.

2. The device according to claim 1, wherein the short circuit unit comprises:
   an inverter configured to invert the test signal; and
   a switching device having a source terminal configured to receive the pumping voltage, a drain terminal configured to receive the external power voltage, and a gate terminal configured to receive the inverted test signal.

3. The device according to claim 1 further comprising:
   a core stress voltage generating unit configured to generate a core stress voltage according to input of the test signal;
   a core voltage comparing unit configured to compare a core reference voltage obtained by amplifying a reference voltage with the core stress voltage, and to output a voltage according to a comparison result; and
   a core voltage driving unit configured to drive the voltage from the core voltage comparing unit, and to output a core voltage, wherein a level gradient variation time and a level gradient of the core voltage are controlled according to a level of the external power voltage when the test signal is enabled.

4. The device according to claim 3, wherein the core stress voltage generating unit comprises:
   a switching circuit configured to selectively output the external power voltage according to an input state of the test signal;
   a voltage dropping circuit configured to drop the external power voltage from the switching circuit, and to control the level gradient variation time of the core voltage; and
   a voltage dividing circuit configured to control the level gradient of the core voltage according to the output from the voltage dropping circuit.

5. The device according to claim 4, wherein the switching circuit comprises a PMOS transistor having a source terminal configured to receive the external power voltage and a gate terminal configured to receive the inverted test signal.

6. The device according to claim 4, wherein the voltage dropping circuit comprises:
   a diode unit including a plurality of diodes connected in series between the switching circuit and the voltage dividing circuit; and
   a switching unit including a plurality of switches respectively connected to the plurality of diodes.

7. The device according to claim 4, wherein the voltage dividing circuit comprises:
   a resistor unit including a plurality of resistors connected in series between the voltage dropping circuit and an output terminal of the core stress voltage; and
   a switching unit including a plurality of switches respectively connected to the plurality of resistors.

8. The device according to claim 1 further comprising:
   a peri stress voltage generating unit configured to generate a peri stress voltage according to input of the test signal;
   a peri voltage comparing unit configured to compare a peri reference voltage obtained by amplifying a reference voltage with the peri stress voltage, and to output a voltage according to a comparison result; and
   a peri voltage driving unit configured to drive the voltage from the peri voltage comparing unit, and outputting a peri voltage, wherein a level gradient variation time and a level gradient of the peri voltage are controlled according to a level of the external power voltage when the test signal is enabled.

9. The device according to claim 8, wherein the peri stress voltage generating unit comprises:
   a switching circuit configured to selectively output the external power voltage according to an input state of the test signal;
   a voltage dropping circuit configured to drop the external power voltage from the switching circuit, and controlling the level gradient variation time of the peri voltage; and
   a voltage dividing circuit configured to control the level gradient of the peri voltage according to the output from the voltage dropping circuit.

10. The device according to claim 9, wherein the switching circuit comprises a PMOS transistor having a source terminal to receive the external power voltage and a gate terminal to receive the inverted test signal.

11. The device according to claim 9, wherein the voltage dropping circuit comprises:
    a diode unit including a plurality of diodes connected in series between the switching circuit and the voltage dividing; and
    a switching unit including a plurality of switches respectively connected to the plurality of diodes.

12. The device according to claim 9, wherein the voltage dividing circuit comprises:
    a resistor unit including a plurality of resistors connected in series between the voltage dropping circuit and an output terminal of the peri stress voltage; and
    a switching unit including a plurality of switches respectively connected to the plurality of resistors.

13. A semiconductor memory test device, comprising:
a core stress voltage generating unit configured to generate a core stress voltage according to input of a test signal;
a core voltage comparing unit configured to compare a core reference voltage obtained by amplifying a reference voltage with the core stress voltage, and to output a voltage according to a comparison result; and
a core voltage driving unit configured to drive the voltage from the core voltage comparing unit, and to output a core voltage, wherein a level gradient variation time and a level gradient of the core voltage are controlled according to a level of an external power voltage when the test signal is enabled.

14. The device according to claim 13, wherein the core stress voltage generating unit comprises:
a switching circuit configured to selectively output the external power voltage according to an input state of the test signal;
a voltage dropping circuit configured to drop the external power voltage from the switching circuit, and to control the level gradient variation time of the core voltage; and
a voltage dividing circuit configured to control the level gradient of the core voltage according to the output from the voltage dropping circuit.

15. The device according to claim 14, wherein the switching circuit comprises a PMOS transistor having a source terminal to receive the external power voltage and a gate terminal to receive an inverted test signal.

16. The device according to claim 14, wherein the voltage dropping circuit comprises:
a diode unit including a plurality of diodes connected in series between the switching circuit and the voltage dividing circuit; and
a switching unit including a plurality of switches respectively connected to the plurality of diodes.

17. The device according to claim 14, wherein the voltage dividing circuit comprises:
a resistor unit including a plurality of resistors connected in series between the voltage dropping circuit and an output terminal of the core stress voltage; and
a switching unit including a plurality of switches respectively connected to the plurality of resistors.

18. A memory test device comprising:
a short circuit configured to maintain a level of pumping voltage at a level of an external power voltage based on a test signal;
a core stress voltage generating circuit configured to generate a core stress voltage based on the test signal; and
a core voltage driving circuit configured to output a core voltage, a level gradient variation time of the core voltage being controlled based on the level of the external power voltage.

19. The memory test device of claim 18, further comprising a pumping voltage generating circuit coupled to the core voltage driving circuit, the pumping voltage generating circuit configured to generate pumping voltage by pumping the core voltage during a normal operation, the pumping voltage generating circuit being further configured to output the external power voltage from the short circuit based on the test signal.

20. The memory test device of claim 18, wherein the short circuit comprises:
an inverter configured to invert the test signal; and
a short circuit switching device coupled to the inverter, a source terminal of the short circuit switching device being configured to receive pumping voltage, a drain terminal of the short circuit switching device being configured to receive the external power voltage, and a gate terminal of the short circuit switching device being configured to receive the inverted test signal.

* * * * *